(12) United States Patent
Loubet et al.

(10) Patent No.: US 9,461,174 B2
(45) Date of Patent: Oct. 4, 2016

(54) METHOD FOR THE FORMATION OF SILICON AND SILICON-GERMANIUM FIN STRUCTURES FOR FINFET DEVICES

(71) Applicants: STMicroelectronics, Inc., Coppell, TX (US); International Business Machines Corporation, Armonk, NY (US)

(72) Inventors: Nicolas Loubet, Guilderland, NY (US); Hong He, Schenectady, NY (US); James Kuss, Hudson, NY (US)

(73) Assignees: STMicroelectronics, Inc., Coppell, TX (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/449,192

(22) Filed: Aug. 1, 2014

(65) Prior Publication Data

US 2016/0035872 A1 Feb. 4, 2016

(51) Int. Cl.
*H01L 29/78* (2006.01)
*H01L 27/12* (2006.01)
*H01L 29/66* (2006.01)

(52) U.S. Cl.
CPC .......... *H01L 29/785* (2013.01); *H01L 27/1211* (2013.01); *H01L 29/66795* (2013.01)

(58) Field of Classification Search
CPC ........... H01L 29/785; H01L 29/66795; H01L 21/823821; H01L 27/0924; H01L 21/823431; H01L 27/0886; H01L 29/7848; H01L 21/02532; H01L 27/1211
See application file for complete search history.

(56) References Cited

U.S. PATENT DOCUMENTS 7,993,999 B2 * 8/2011 Basker ............... H01L 21/845
 438/151
2014/0357060 A1 * 12/2014 Liu et al. .................. 438/479

* cited by examiner

*Primary Examiner* — Roy Potter
*Assistant Examiner* — Paul Patton
(74) *Attorney, Agent, or Firm* — Gardere Wynne Sewell LLP

(57) ABSTRACT

A substrate layer formed of a first semiconductor material includes adjacent first and second regions. Fin structures are formed from the substrate layer in both the first and second regions. At least the side walls of the fin structures in the second region are covered with an epitaxially grown layer of second semiconductor material. A drive in process is performed to convert the fin structures in the second region from the first semiconductor material to the second semiconductor material. The first semiconductor material is, for example, silicon, and the second semiconductor material is, for example, silicon germanium or silicon carbide. The fin structures in the first region are provided for a FinFET of a first (for example, n-channel) conductivity type while the fin structures in the second region are provided for a FinFET of a second (for example, p-channel) conductivity type.

16 Claims, 11 Drawing Sheets

US 9,461,174 B2

METHOD FOR THE FORMATION OF SILICON AND SILICON-GERMANIUM FIN STRUCTURES FOR FINFET DEVICES

TECHNICAL FIELD

The present invention relates to integrated circuits and, in particular, to a process for the formation of fin structures for use in FinFET-type integrated circuit devices.

BACKGROUND

The prior art teaches the formation of integrated circuits which utilize one or more FinFET type field effect transistors. The FinFET transistor comprises a channel region which is oriented to conduct an electrical current parallel to the surface of the substrate. The channel region is provided in an elongated section of semiconductor material referred to as a "fin". The source and drain regions of the transistor are formed in the elongated section on either side of the channel region. A gate is placed over and on both opposed sides of the elongated section at the location of the channel region to provide control over the conductive state of the transistor. This FinFET design is well suited for manufacturing a multi-channel transistor in which multiple elongated sections are formed in parallel to define neighboring channel regions which are separated from each other by an intermediate gate portion of the transistor gate spanning with a perpendicular orientation over the multiple elongated sections.

To avoid leakage currents, it is known in the art to fabricate the FinFET transistor on an integrated circuit substrate which is of the Silicon-on-Insulator (SOI) type. Such an SOI substrate comprises, in a lower part, an intermediate layer of electrically insulating material which is topped by a crystalline silicon layer. Reference is made to U.S. Pat. No. 6,645,797, the disclosure of which is incorporated by reference, which teaches a process for realizing a FinFET transistor from an SOI substrate. The transistor which is obtained is electrically insulated from the lower part of the substrate by the intermediate layer of insulating material, and thus leakage current concerns are reduced.

The FinFET transistor implemented on an SOI substrate is considered by those skilled in the art as an attractive option for use in connection with circuits fabricated at aggressively scaled process technology nodes, and in particular is well suited for use in CMOS integrated circuit designs. Superior short channel control along with higher performance in comparison to conventional planar bulk devices are recognized as advantages associated with the selection of the FinFET for CMOS circuits.

However, as CMOS process technology continues to scale towards smaller and smaller dimensions, further improvement in transistor performance is needed. Those skilled in the art recognize that the use of silicon-germanium (SiGe) materials for transistor fabrication provide for a significant boost in transistor performance, especially with respect to p-channel field effect transistor devices. Indeed, the art is moving towards the use of SiGe for p-channel devices implemented in both bulk device technology and SOI technology. Specific to the use of FinFET devices, those skilled in art recognize a need to form the fin of the p-channel device from a SiGe material in order to reach improved transistor performance levels over prior art Si material only devices.

The formation of a SiGe fin for a FinFET device is not without challenge. Fabrication techniques known in the art for SiGe fabrication use an extensive thermal budget. These thermal treatments can cause germanium to diffuse from the substrate regions where p-channel devices are being fabricated. This is of particular concern in connection with the fabrication of CMOS circuitry as the Ge from the SiGe material may diffuse into the adjacent substrate regions where n-channel devices are being fabricated and adversely affect the performance of the n-channel devices. To address the issue of Ge diffusion, a different fabrication technique forms the SiGe fins (for the p-channel devices) after the Si fins (for the n-channel devices) have been defined. However, such devices suffer from a concern over non-uniform fin shape due to the difficulty of forming a uniform SiGe epitaxy around the fin.

There is accordingly a need in the art for a fin fabrication process that does not suffer from the foregoing problems.

SUMMARY

In an embodiment, a method comprises: in a substrate layer formed of a first semiconductor material and having a first region which is adjacent to a second region, removing portions of first semiconductor material of the substrate layer in both the first and second regions to define fins made of the first semiconductor material, wherein the fins in the first region define a first fin structure of a FinFET transistor of a first conductivity type; converting the fins in the second region made of said first semiconductor material into converted fins made of a second semiconductor material which are wider that said fins made of the first semiconductor material; and laterally reducing a width of the converted fins made of the second semiconductor material in the second region to define a second fin structure of a FinFET transistor of a second conductivity type.

In an embodiment, an apparatus comprises: a substrate layer formed of a first semiconductor material and having a first region which is adjacent to a second region; a first plurality of fins made of the substrate layer of the first semiconductor material in the first region, wherein the fins in the first region define a first fin structure of a FinFET transistor of a first conductivity type; and a second plurality of fins made from converting fins in the second region made of said first semiconductor material into converted fins made of a second semiconductor material, wherein the fins in the second region define a second fin structure of a FinFET transistor of a second conductivity type.

BRIEF DESCRIPTION OF THE DRAWINGS

For a better understanding of the embodiments, reference will now be made by way of example only to the accompanying figures in which.

DETAILED DESCRIPTION OF THE DRAWINGS

A process for forming Si and SiGe fins is shown in FIGS. 1-6.

Figure 1:
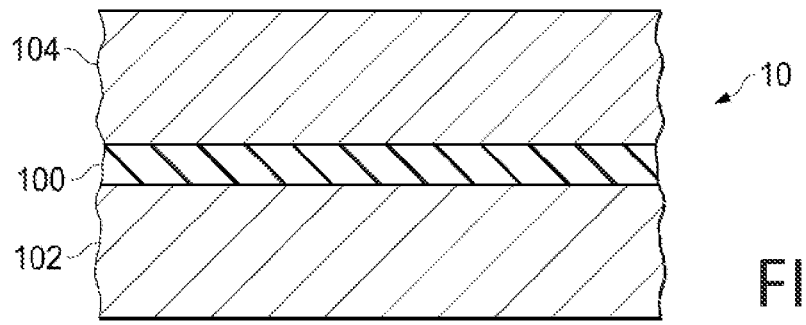
FIGS. 1-6 illustrate process steps in the formation of fins for a FinFET device on a Silicon-on-Insulator (SOI) substrate.

FIG. 1 shows a thick silicon-on-insulator (SOI) substrate 10 formed by an insulator layer 100 of silicon dioxide on a first silicon (Si) layer 102. A second silicon (Si) layer 104 is formed over the insulator layer 100. The first and second silicon layers 102 and 104 may be doped as needed for the integrated circuit application. The thickness of the first and second silicon layers 102 and 104 may be tuned (for example, through the use of a thinning operation) as needed for the integrated circuit application. The substrate may be partially depleted (PD-SOI) or fully depleted (FD-SOI).

Figure 2:
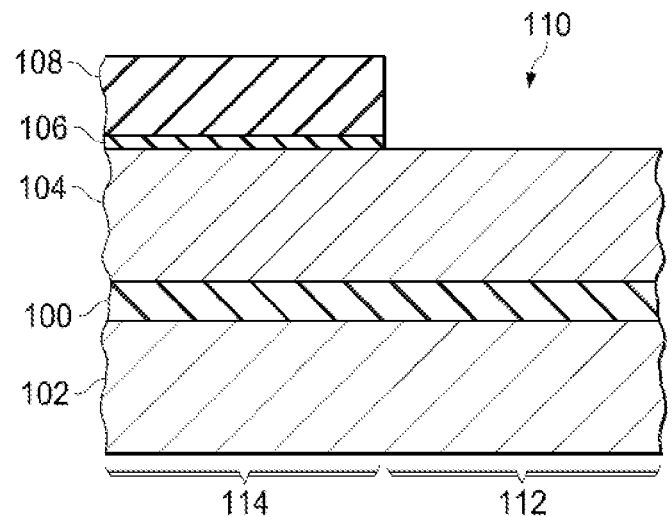

A silicon dioxide (SiO$_2$) layer 106 is deposited over the second silicon (Si) layer 104, and a silicon nitride (SiN) layer 108 is deposited over the silicon dioxide layer 106. A lithographic process as known in the art is then used to form an opening 110 in the silicon nitride layer 108 and silicon dioxide layer 106 (thus defining a SiN/SiO$_2$ hard mask) which extends down to reach at least the top surface of the second silicon (Si) layer 104. The result of the lithographic process is shown in FIG. 2. The opening 110 is associated with a region 112 of the substrate reserved for the formation of p-channel FinFET devices. The region 114 of the substrate is conversely reserved for the formation of n-channel FinFET devices.

Figure 3:
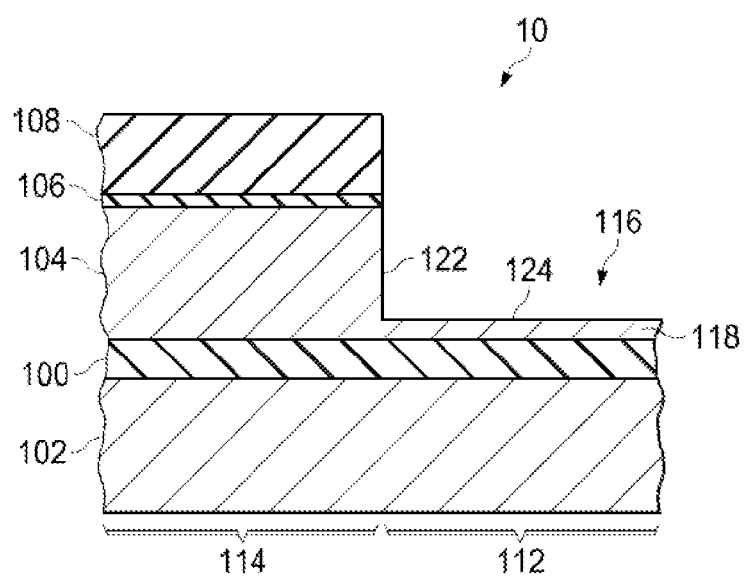

A highly directional etching process (such as reactive ion etching (RIE) as known in the art) is then performed to remove a portion 116 of the second silicon (Si) layer 104 within the region 112. The result of the directional etch process is shown in FIG. 3. It will be noted that a portion 118 of the second silicon (Si) layer 104 remains in the region 112 after the directional etch is completed.

Figure 4:
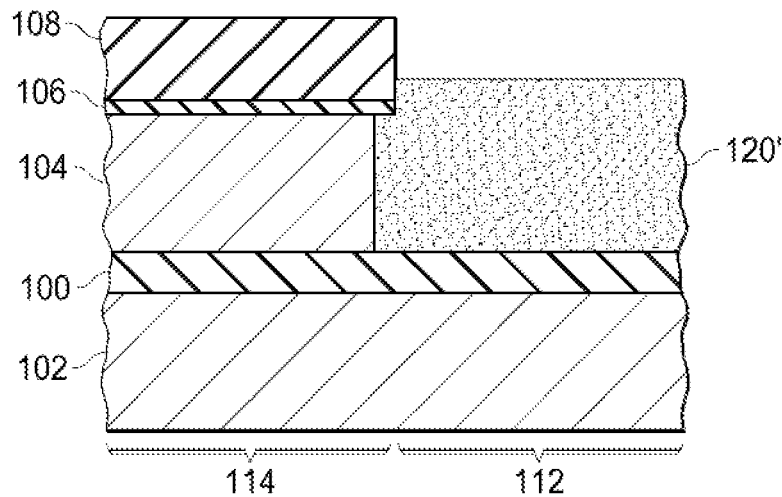

One or more epitaxial growth processes, as known in the art, as well as a condensation operation, for example of the rapid thermal oxidation (RTO) type, or an anneal, are then performed to grow an undoped silicon-germanium (SiGe) region 120' from the remaining portion 118 of the second silicon (Si) layer 104. The result of the epitaxial growth process is shown in FIG. 4. The stippling in FIG. 4 is provided to differentiate SiGe material from Si material.

It may occur that there is some lateral Ge diffusion into the portion of the second silicon (Si) layer 104. This lateral extension of the SiGe region 120' can be of concern if the lateral diffusion is not controlled to be well below the minimum spacing requirements (about 20 nm as known in the art) between n-channel region 114 and p-channel region 112 necessary to support CMOS integrated circuitry.

The epitaxial growth of SiGe region 120' in region 112 preferably achieves a depth equal to or exceeding the depth of the second silicon (Si) layer 104 in region 114. In a preferred implementation, a SiGe epitaxial growth of more than 20 nm is effectuated.

Figure 5:
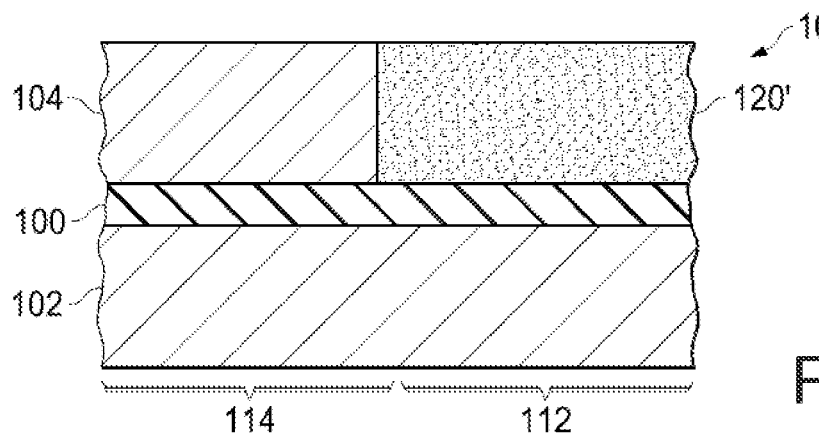

The SiN/SiO$_2$ hard mask (layers 106 and 108) is then removed. The top surface may already be planar. If not, a planarization process (for example, chemical-mechanical polishing (CMP)) may be used to flatten the top of the substrate 10. In either case, there is provided an equalized depth of the silicon-germanium (SiGe) region 120' in region 112 and the depth of the second silicon (Si) layer 104 in region 114. This is shown in FIG. 5.

Figure 6:
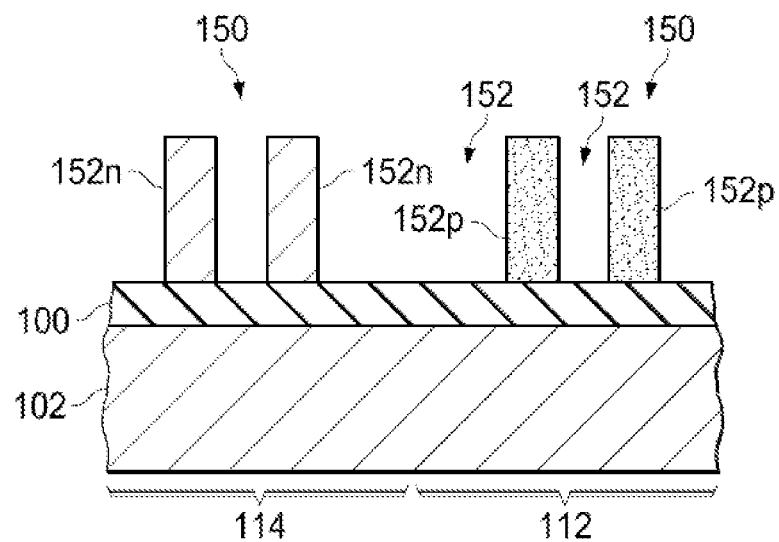

A lithographic process as known in the art is then used to define the fins 150 for the FinFET devices. A lithographic mask is applied over the top surface of the silicon-germanium (SiGe) region 120' in region 112 and the second silicon (Si) layer 104 in region 114. The mask is patterned to leave mask material at the desired locations of the fins 150. An etching operation (such as using RIE) is then performed to open apertures 152 in the silicon-germanium (SiGe) region 120' in region 112 and in the second silicon (Si) layer 104 in region 114 on either side of each fin 150. The result of the etching process is shown in FIG. 6. Again, the stippling in FIG. 6 is provided to differentiate fins made of SiGe material from fins made of Si material. The fins 150 include silicon fins 152p for use in forming p-channel transistors in the region 112 and silicon-germanium fins 152n for use in forming n-channel transistors in the region 114.

The remaining process steps for completing fabrication of the FinFET transistors from the structure including fins 150 is well known to those skilled in the art.

A number of possible problems with the process of FIGS. 1-6 include: a) an undesirable etch profile could lead to n/p region overlay issues (20 nm minimum as discussed above); b) the transistor device channel for the p-channel transistors in the region 112 is formed by epitaxy, and device performance can be adversely impacted by the quality of the epitaxial growth process (necessitating a high temperature pre-bake and pristine growth conditions); c) the height of the fins is to some degree limited by height of the SiGe epitaxial growth for region 120'; d) it is difficult to achieve a high percentage of Ge in the SiGe channel region without performing relaxation of SiGe; and e) there is a limited thermal budget available for use in forming shallow trench isolation (STI) structures between the regions 112 and 114 in order to avoid concerns with SiGe relaxation or diffusion.

Reference is now made to FIGS. 7-17 which illustrate the process steps in the formation of fins for a FinFET device on a Silicon-on-Insulator (SOI) substrate.

Figure 7:
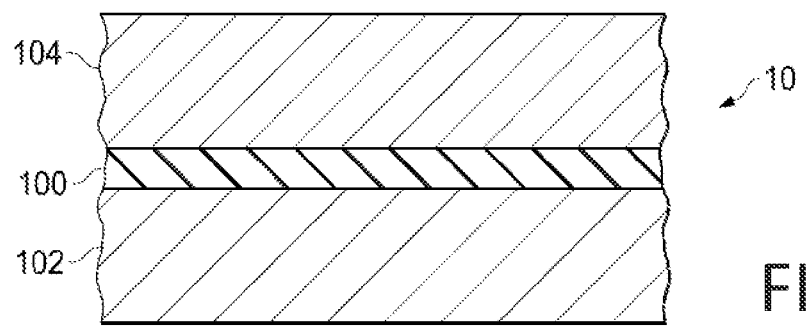
FIGS. 7-17 illustrate process steps in the formation of fins for a FinFET device on a Silicon-on-Insulator (SOI) substrate.

FIG. 7 shows a conventional silicon-on-insulator (SOI) substrate 10 including an insulator layer 100 of silicon dioxide formed on a first semiconductor (silicon (Si)) layer 102. A second semiconductor (silicon (Si)) layer 104 is formed over the insulator layer 100. The SOI substrate 10 may be of the partially-depleted (PD) type (i.e., the substrate 10 comprises PD SOI as known in the art) or of the fully-depleted (FD) type (i.e., the substrate 10 comprises FD SOI as known in the art). The first and second silicon layers 102 and 104 may be doped as needed for the integrated circuit application. The thickness of the first and second silicon layers 102 and 104 may be tuned (for example, through the use of a thinning operation) as needed for the integrated circuit application. In a preferred implementation, the second silicon (Si) layer 104 has a thickness of about 10-50 nm, and more specifically has a thickness substantially corresponding to a preferred height of the fin structures being formed for FinFET devices. The insulating layer 100 may have a thickness of about 10-250 nm, and thus the substrate 10 may take the form of a thick SOI substrate, an extremely thin SOI substrate or an ultra-thin body and buried oxide (UTBB) substrate, as known in the art.

Figure 8:
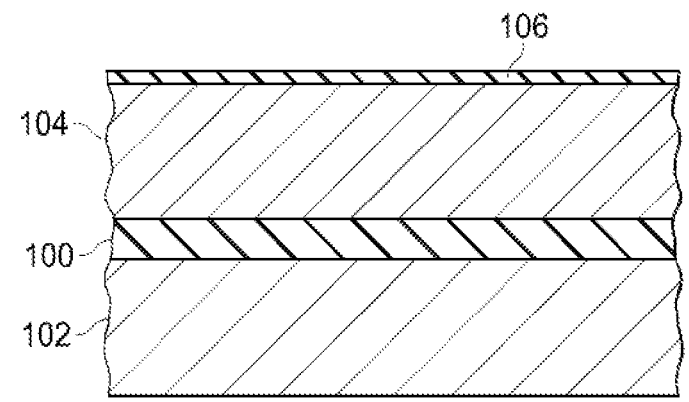

FIG. 8 shows the deposit of a silicon dioxide (SiO$_2$) layer 106 over the second silicon (Si) layer 104.

Figure 9:
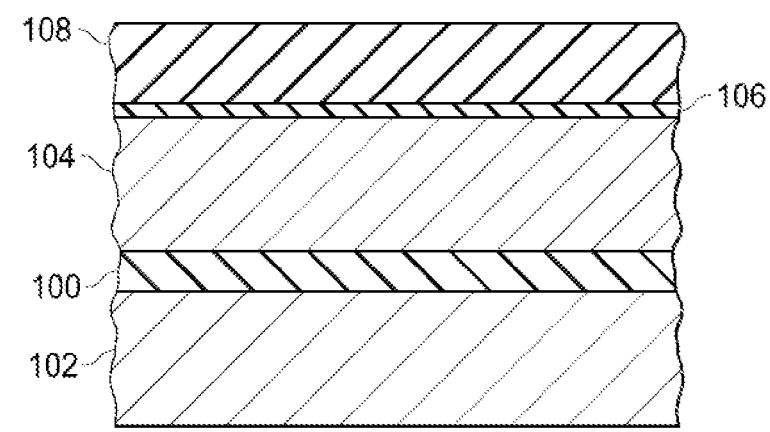

FIG. 9 shows the deposit of a silicon nitride (SiN) layer 108 over the silicon dioxide layer 106.

Although both the SiO$_2$ layer and the SiN layer may be preferred to form a hard mask structure, it will be understood that only one of the layers could be used in certain masking applications.

Figure 10:
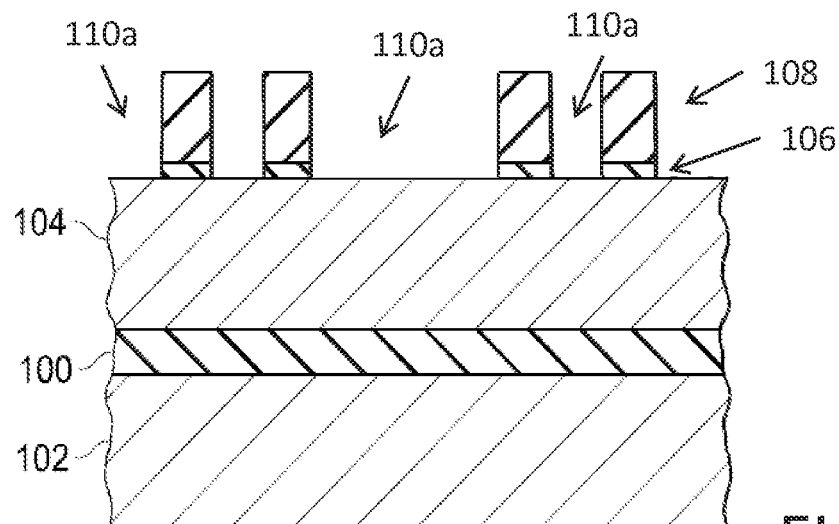

A lithographic process as known in the art is then used to form openings 110a in the silicon nitride layer 108 and silicon dioxide layer 106 (a SiN/SiO$_2$ hard mask). The openings 110a each extend down through the layers 106 and 108 to reach at least to the top surface of the second silicon (Si) layer 104. The result of the lithographic process is shown in FIG. 10. The lithographic patterning of the hard mask accordingly leaves mask material at the desired locations of fins of semiconductor material to be formed by later process steps.

Figure 11:
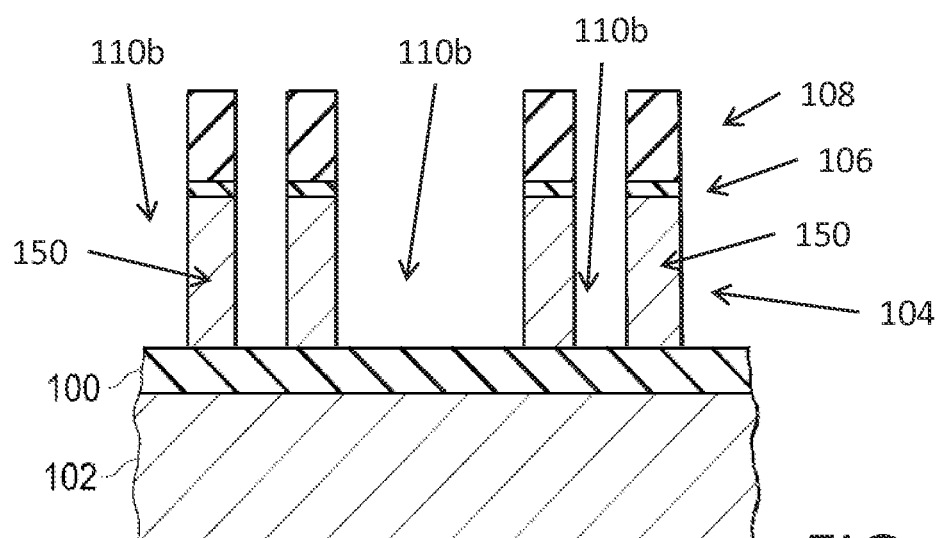

A highly directional etch process as known in the art is then performed to remove portions of the second silicon (Si) layer 104 through the openings 110a. In an embodiment, the directional etch may comprise a reactive ion etch (RIE). The result of the directional etch process is shown in FIG. 11 with openings 110b formed between remaining portions of the second silicon (Si) layer 104 which define fins 150.

Figure 12:
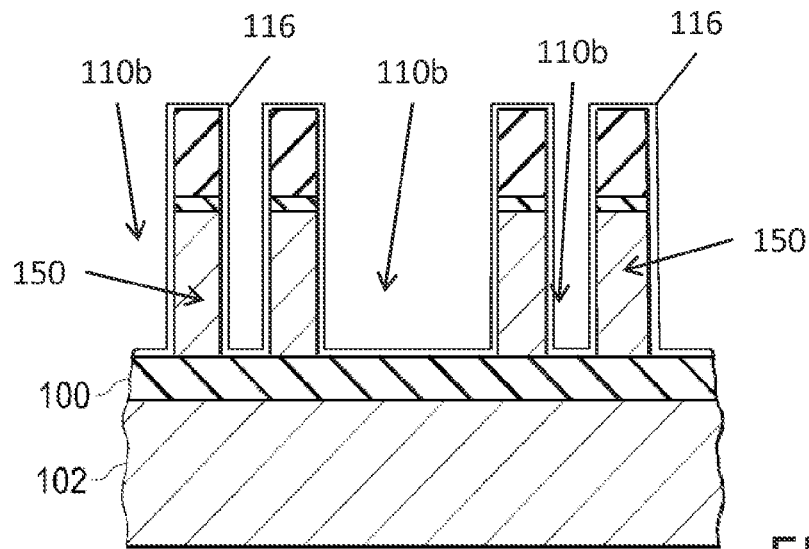

A masking layer 116 is then conformally deposited over the wafer to cover the fins 150 and the fin etch mask (remaining portions of layers 106 and 108) as well as the top surface of the insulating layer 100. The masking layer 112 may comprise, for example, SiN. Alternatively, the layer 116 may comprise a bi-layer formed by $SiO_2$ and SiN. The conformal deposit may be made using an atomic layer deposition (ALD) or reduced pressure chemical vapor deposition (RP-CVD) process. The layer 116 may have a thickness in the range of 3-30 nm. The result of the conformal deposit of the mask layer is shown in FIG. 12.

Figure 13:
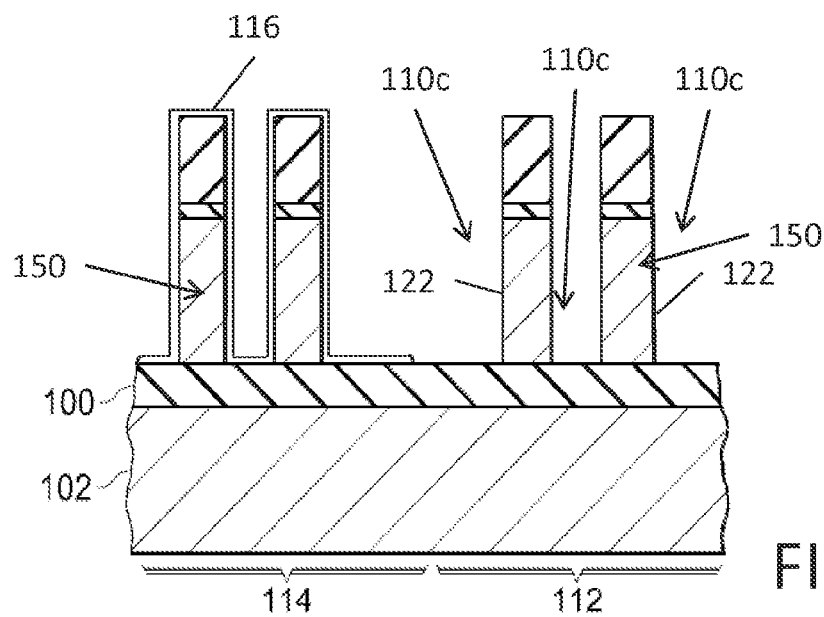

A lithographic process known in the art is then used to selectively remove the mask layer 116 in a region 112 of the substrate and form openings 110c which expose side surfaces 122 of the fins 150. The result is shown in FIG. 13. The region 112 of the substrate is reserved for the formation of p-channel FinFET devices. The region 114 of the substrate which remains covered by the layer 116 is conversely reserved for the formation of n-channel FinFET devices. Thus, the process described and illustrated primarily concerns the formation of CMOS type integrated circuits, although it will be understood that this is not the only application of the described process. The process to reach the result of FIG. 13 comprises, for example, a block lithography using a resist material to mask off the region 114, the removal of the layer 116 within the region 112 using the mask and an RIE process, a removal of the mask resist material and a surface preparation of the substrate wafer in the region 112 in anticipation of subsequent epitaxial growth.

Figure 14:
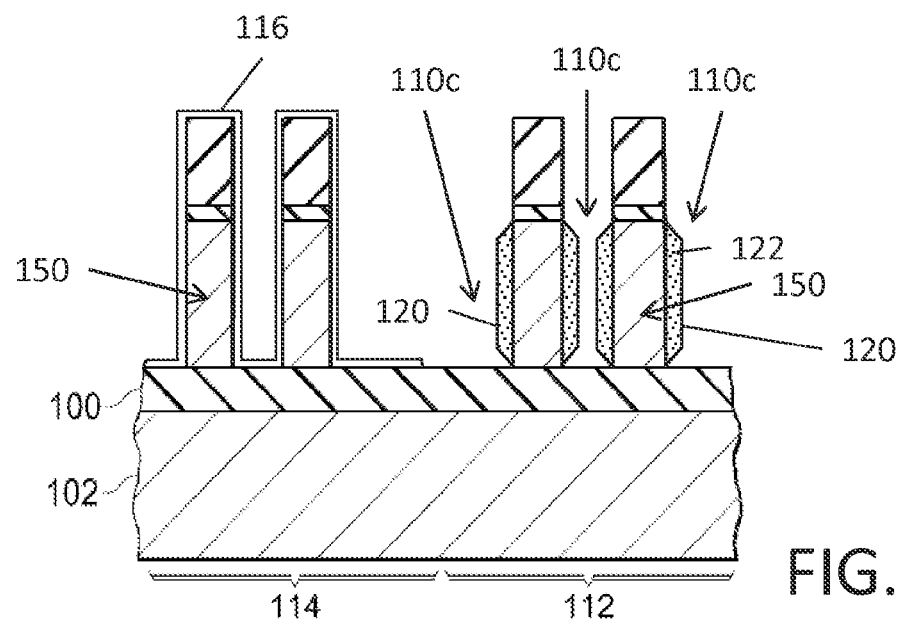

An epitaxial growth process as known in the art is then performed to grow a silicon-germanium (SiGe) layer 120 on the exposed side surfaces 122 of the fins 150 made from the second silicon (Si) layer 104 in the region 112. The result of the epitaxial growth process is shown in FIG. 14. The stippling in FIG. 14 is provided to differentiate SiGe material of the layer 120 from the Si material of the fins 150. The thickness of the silicon-germanium (SiGe) layer 120 in region 112 is about 3 nm to 20 nm, and the germanium content ranges between 15-55%. Although a growth containing Ge is preferred, it will be understood that other materials selected from Group III-V of the Periodic Table could alternatively be selected. For example, the layer 120 could instead comprise SiC. The shape of the epitaxial growth for layer 120 depends on substrate orientation, and thus illustrated shape is merely exemplary of the growth.

Figure 15:
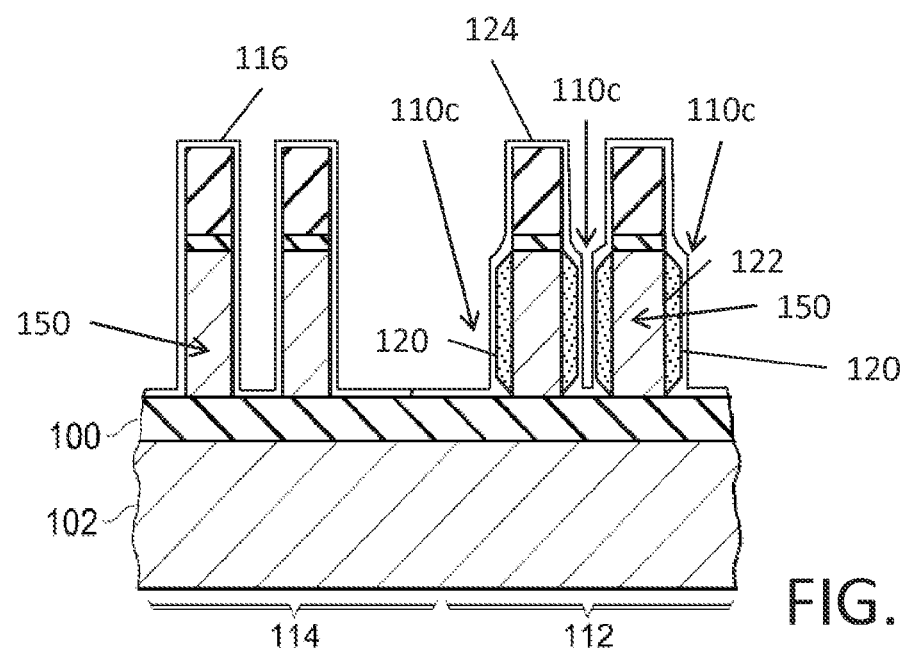

FIG. 15 shows the conformal deposit of a silicon dioxide ($SiO_2$) layer 124 over the wafer in region 112 so as to cover the layer 120. As an alternative, the layer 124 could instead comprise SiN. The layer 124 may be deposited using an atomic layer deposition (ALD) or reduced pressure chemical vapor deposition (RP-CVD) process.

Figure 16:
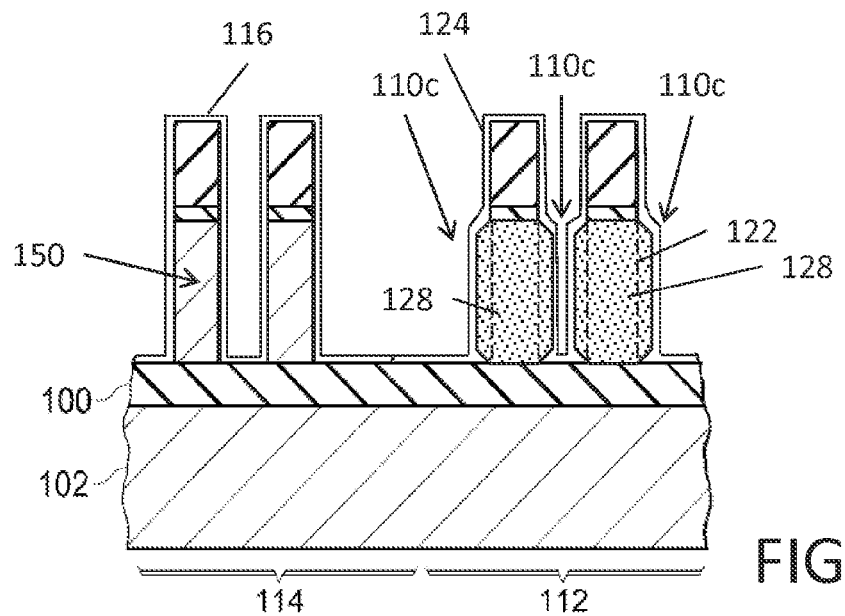

Next, a condensation operation, for example of the rapid thermal oxidation (RTO) type, is performed to drive the Ge from the silicon-germanium (SiGe) layer 120 into the fins 150 made from second silicon (Si) layer 104 in the region 112. In particular, the drive-in converts layer 120 and the fins 150 made of the second silicon (Si) layer 104 within the region 112 into SiGe regions 128. The result of the drive-in process is shown in FIG. 16. Again, the stippling in FIG. 16 is provided to differentiate SiGe material from Si material. The dotted lines in FIG. 16 are provided to illustrate the previous locations of the side surfaces 122 in relation to the formed SiGe region 128.

As an alternative to performing the condensation operation for drive-in, a higher temperature anneal process may be performed to cause a mixing of the SiGe material of the silicon-germanium (SiGe) layer 120 with the portion of the second silicon (Si) layer 104 defining the fins 150 in the region 112.

Figure 17:
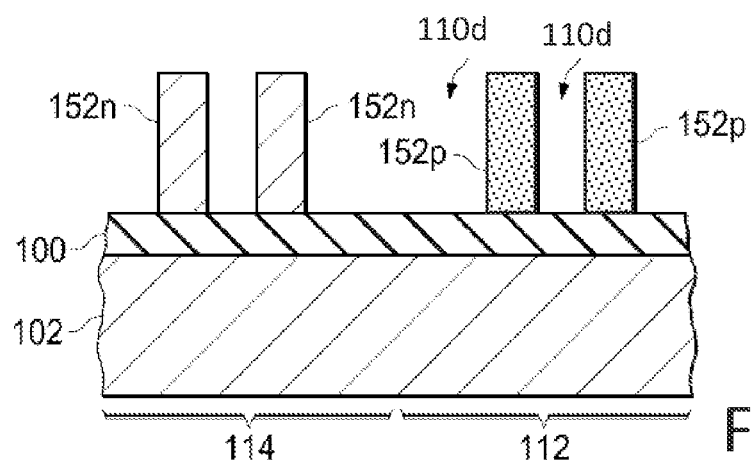

An etching operation is then performed to remove the layer 124 and reduce the lateral thickness of the formed SiGe region 128. This etching process advantageously uses the remaining portions of the layers 106 and 108 defining the fin mask to protect the central portion of the formed SiGe region 128 while the lateral portions are selectively removed. The layers 106 and 108 are removed which leaves fins 152n comprised of silicon in the region 114 and fins 152p comprised of silicon-germanium in the region 112. The fins are separated by openings 110d. The result is shown in FIG. 17. The etching process used to form the fins 152n and 152p may, for example, comprise an RIE etch as known in the art.

The remaining process steps for completing fabrication of the FinFET transistors from the structure including fins 150 is well known to those skilled in the art.

Although use of an SOI substrate may be preferred in many implementations, it will be understood that the process for forming both Si and SiGe fins is applicable to other types of substrates, including for use with bulk-type substrates.

Reference is now made to FIGS. 18-27 which illustrate process steps in the formation of fins for a FinFET device on a bulk substrate.

Figure 18:
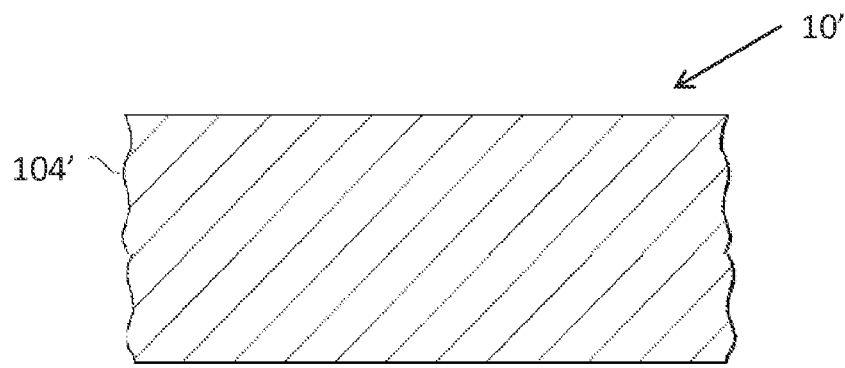
FIGS. 18-27 illustrate process steps in the formation of fins for a FinFET device on a bulk substrate.

FIG. 18 shows a starting bulk substrate wafer 10'. The wafer 10' comprises a semiconductor material layer 104', for example, made of silicon, doped as appropriate for the semiconductor application. The layer 104' may comprise a number of epitaxially grown layers.

Figure 19:
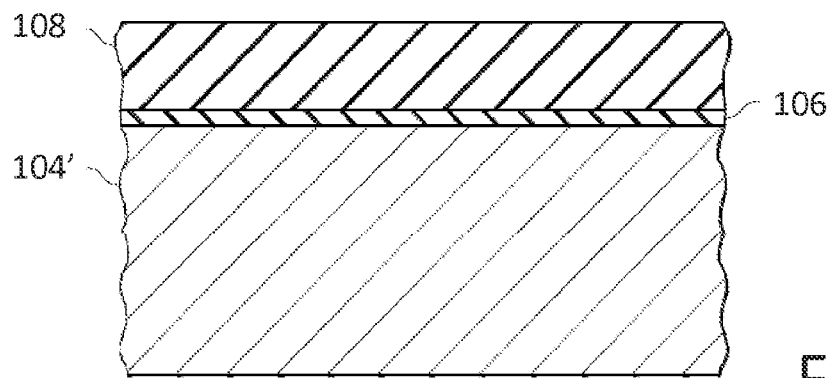

FIG. 19 shows the deposit of a silicon dioxide ($SiO_2$) layer 106 over the bulk silicon layer 104' and the deposit of a silicon nitride (SiN) layer 108 over the silicon dioxide layer 106. The deposits may be made, for example, using an atomic layer deposition (ALD) or reduced pressure chemical vapor deposition (RP-CVD) process.

Although both the $SiO_2$ layer and the SiN layer may be preferred to form a hard mask structure, it will be understood that only one of the layers could be used in certain masking applications.

Figure 20:
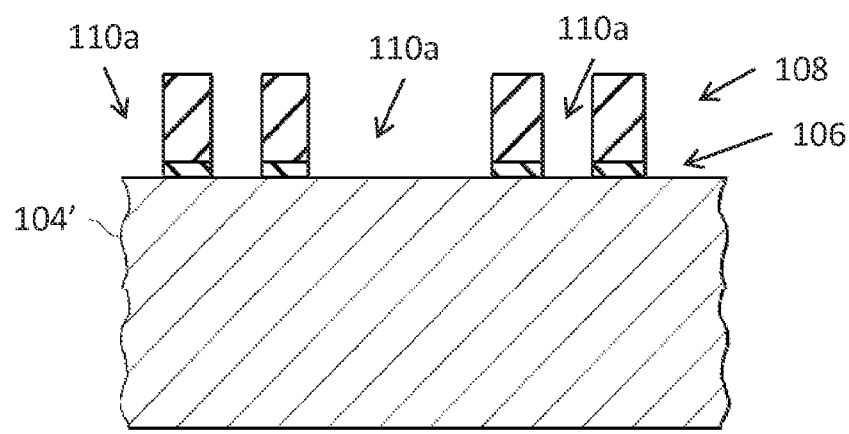

A lithographic process as known in the art is then used to form openings 110a in the silicon nitride layer 108 and silicon dioxide layer 106 (a SiN/$SiO_2$ hard mask). The openings 110a extend through the layers 106 and 108 to reach at least the top surface of the silicon substrate layer 104'. The result of the lithographic process is shown in FIG. 20. The lithographic patterning of the hard mask accordingly leaves mask material at the desired locations of the fins.

Figure 21:
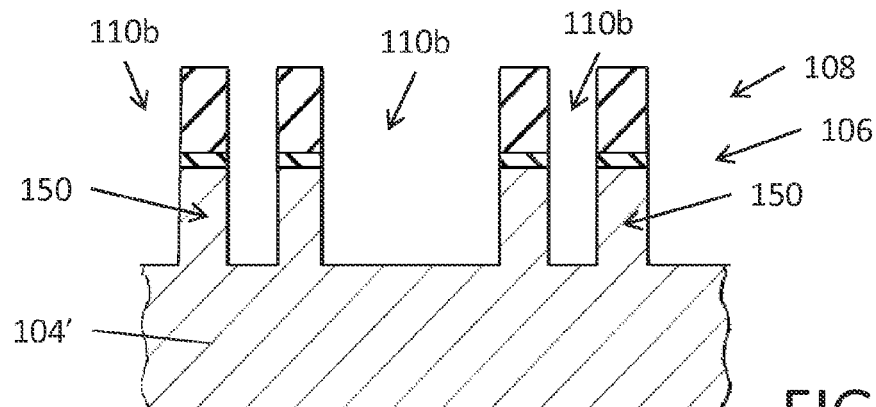

A highly directional etch process as known in the art is then performed to remove portions of the silicon substrate layer 104' through the openings 110b. In an embodiment, the directional etch may comprise an RIE etch. The result of the directional etch process is shown in FIG. 21 with openings 110b formed between remaining portions of the silicon layer 104' which define fins 150.

Figure 22:
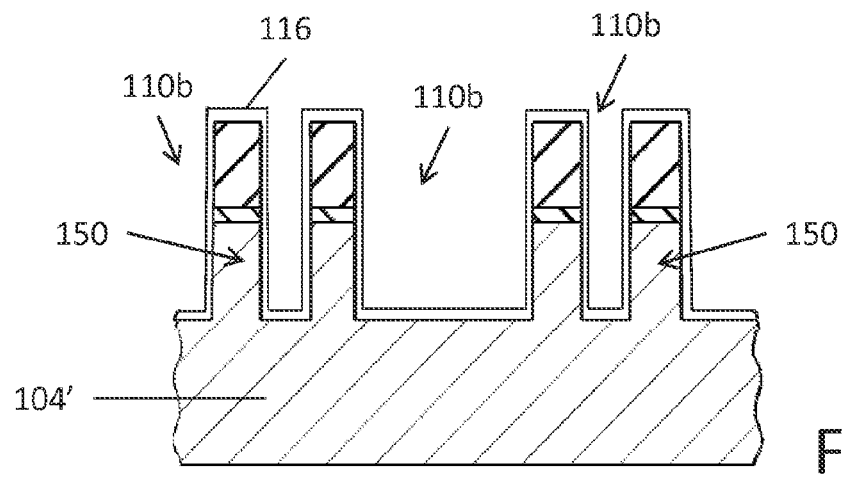

A masking layer 116 is then conformally deposited over the wafer to cover the fins 150 and the fin etch mask. The masking layer 112 may comprise, for example, SiN. Alternatively, the layer 116 may comprise a bi-layer formed by $SiO_2$ and SiN. The conformal deposit may be made by an atomic layer deposition (ALD) or reduced pressure chemical vapor deposition (RP-CVD) process. The layer 116 may have a thickness in the range of 3-30 nm. The result of the conformal deposit of the mask is shown in FIG. 22.

Figure 23:
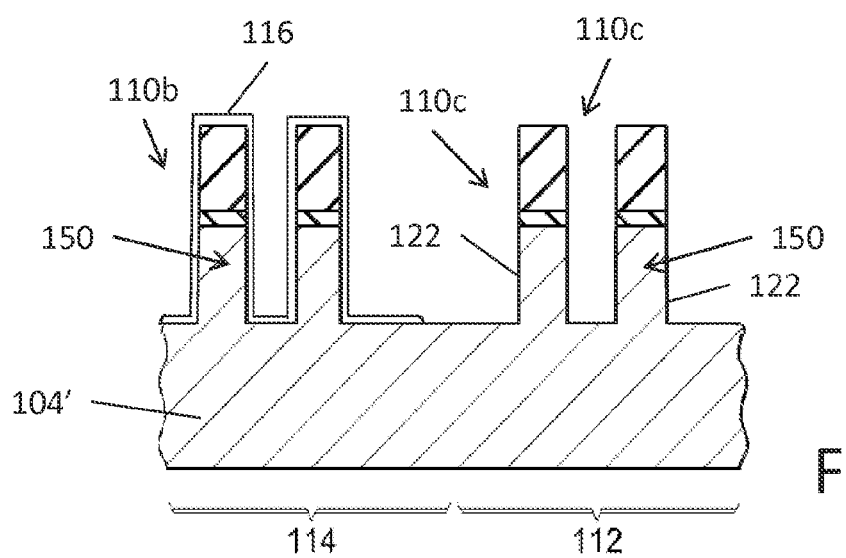

A lithographic process known in the art is then used to selectively remove the mask layer 116 in a region 112 of the substrate and form openings 110c which expose side surfaces 122 of the fins 150 and a top surface of the substrate 104'. The result is shown in FIG. 23. The region 112 of the substrate is reserved for the formation of p-channel FinFET devices. The region 114 of the substrate which remains covered by the layer 116 is conversely reserved for the formation of n-channel FinFET devices. Thus, the process described and illustrated primarily concerns the formation of CMOS type integrated circuits, although it will be understood that this is not the only application of the described process. The process to reach the result of FIG. 23 comprises, for example, a block lithography using a resist material to mask off the region 114, the removal of the layer 116 within the region 112 using an RIE process, a removal of the mask resist material and a surface preparation of the wafer in anticipation of subsequent epitaxial growth.

Figure 24:
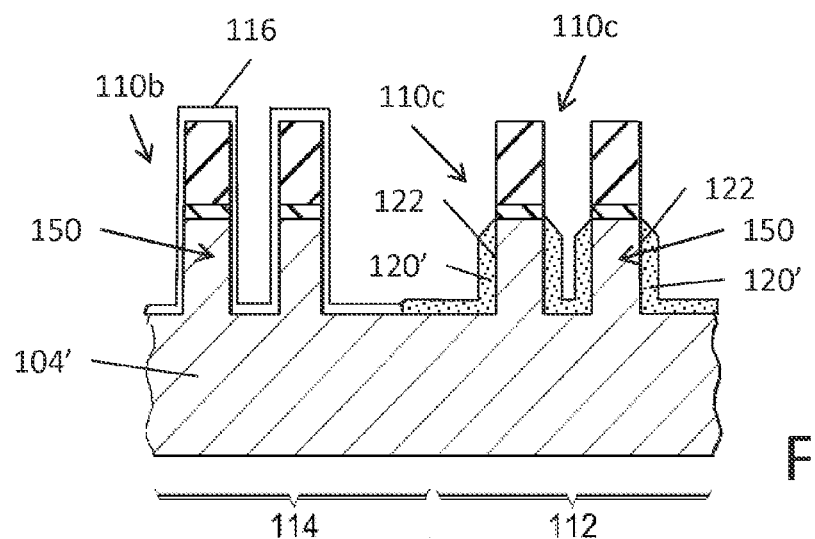

An epitaxial growth process as known in the art is then performed to grow a silicon-germanium (SiGe) layer 120' on the exposed surfaces 122 of the fins 150 and top surface of the silicon substrate layer 104' in the region 112. The result of the epitaxial growth process is shown in FIG. 24. The stippling in FIG. 24 is provided to differentiate SiGe material of the layer 120' from the Si material of the fins 150. The thickness of the silicon-germanium (SiGe) layer 120 in region 112 is about 3 nm to 20 nm, and the Ge content ranges between 15-55%. Although a growth containing germanium is preferred, it will be understood that other materials selected from Group III-V of the Periodic Table could alternatively be selected. For example, the layer 120' could instead comprise SiC. The shape of the epitaxial growth for layer 120' depends on substrate orientation, and thus illustrated shape is exemplary only.

Figure 25:
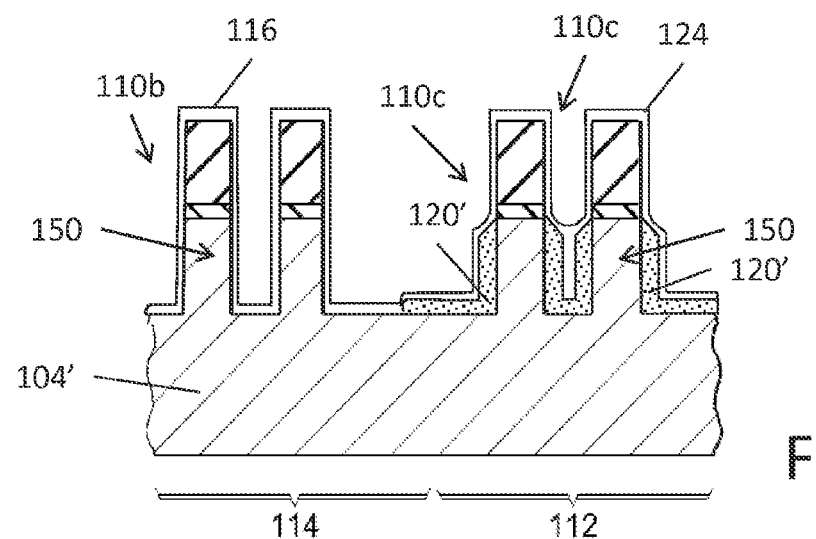

FIG. 25 shows the conformal deposit of a silicon dioxide ($SiO_2$) layer 124 over the wafer in region 112 so as to cover the layer 120'. As an alternative, the layer 124 could instead comprise SiN. The layer 124 may be deposited using an atomic layer deposition (ALD) or reduced pressure chemical vapor deposition (RP-CVD) process.

Figure 26:
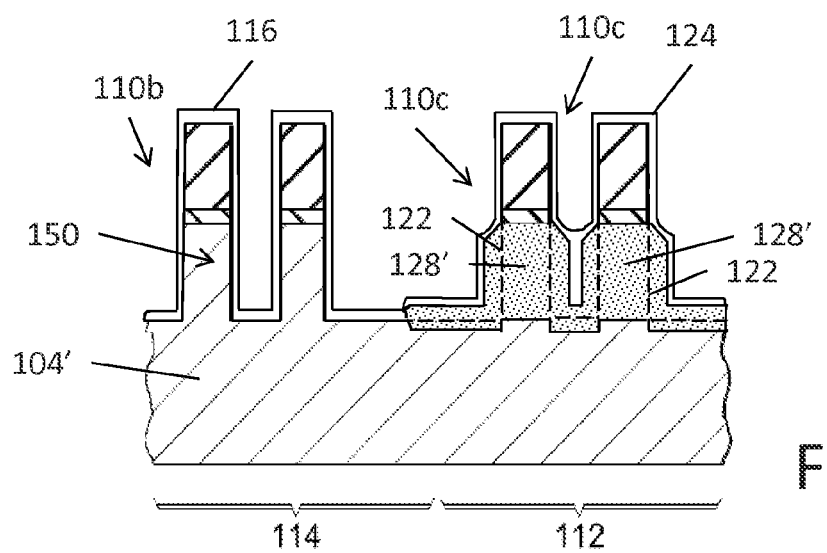

Next, a condensation operation, for example of the rapid thermal oxidation (RTO) type, is performed to drive the Ge from the silicon-germanium (SiGe) layer 120' into the fins 150 made from silicon layer 104' in the region 112. In particular, the drive-in converts the fins 150 and a portion of the substrate made of the silicon layer 104' within the region 112 into SiGe regions 128'. The result of the drive-in process is shown in FIG. 26. Again, the stippling in FIG. 26 is provided to differentiate SiGe material from Si material. The dotted line in FIG. 26 is provided to illustrate the previous location of the surfaces 122 in relation to the formed SiGe region 128'.

As an alternative to performing the condensation operation for drive-in, a higher temperature anneal process may be performed to cause a mixing of the SiGe material of the silicon-germanium (SiGe) layer 120' with the portion of the silicon layer 104' defining the fins 150 in the region 112.

Figure 27:
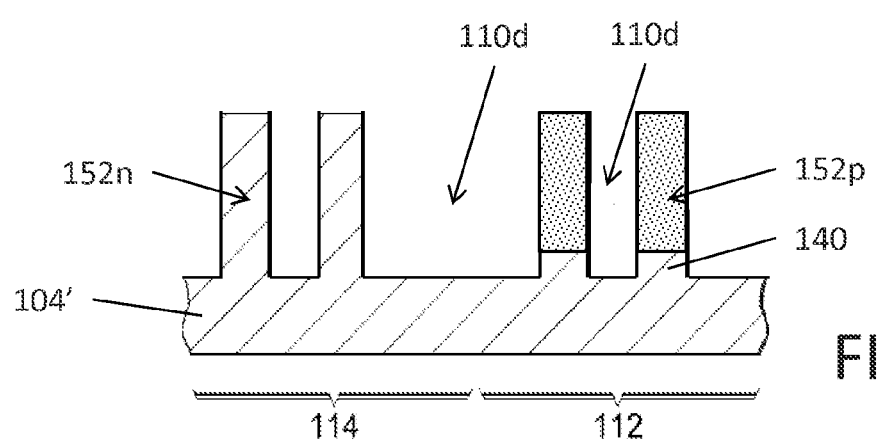

An etching operation is then performed to remove the layer 124 and reduce the lateral thickness of the formed SiGe region 128'. This etching process advantageously uses the remaining portions of the layers 106 and 108 defining the fin mask to protect the central portion of the formed SiGe region 128' while the lateral portions are removed. The etching operation further extends the openings 110c deeper into the wafer substrate such that the SiGe region 128' is supported by a fin region 140 extending above the etched top surface of the substrate. The layers 106 and 108 are removed which leaves fins 152n comprised of silicon in the region 114 and fins 152p comprised of silicon-germanium resting on a silicon portion in the region 112, wherein the fins are separated by openings 110d. The result is shown in FIG. 27. The etching process used to form the fins 152n and 152p may, for example, comprise an RIE etch as known in the art.

The remaining process steps for completing fabrication of the FinFET transistors from the structure including fins 150 is well known to those skilled in the art.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A method, comprising:
    in a substrate layer formed of a first semiconductor material that is a top semiconductor layer of a silicon-on-insulator (SOI) substrate and having a first region which is adjacent to a second region, removing portions of first semiconductor material of the substrate layer in both the first and second regions to define fins made of the first semiconductor material, wherein the fins in the first region define a first fin structure of a FinFET transistor of a first conductivity type;
    converting the fins in the second region made of said first semiconductor material into converted fins made of a second semiconductor material, wherein converting the fins in the second region further comprises:
        covering the fins in the first region with a first protective layer;
        epitaxially growing said second semiconductor material to cover side walls of the fins in the second region;
        covering the second semiconductor material with a second protective layer;
        driving said second semiconductor material into the fins made of the first semiconductor material to produce the converted fins made of the second semiconductor material which are wider than said fins made of the first semiconductor material; and
        removing the first and second protective layers; and
    laterally reducing a width of the converted fins made of the second semiconductor material in the second region to define a second fin structure of a FinFET transistor of a second conductivity type.

2. The method of claim 1, wherein removing portions comprises:
    masking the substrate layer with a fin mask;
    etching the substrate layer through said fin mask to remove portions of first semiconductor material of the substrate layer down to an insulating layer of the SOI substrate.

3. The method of claim 1, wherein laterally reducing comprises etching away wider portions of the converted fins made of the second semiconductor material.

4. The method of claim 1, wherein driving comprises performing one of a condensation or anneal process.

5. A method, of comprising:
in a bulk substrate layer formed of a first semiconductor material and having a first region which is adjacent to a second region, removing portions of first semiconductor material of the bulk substrate layer in both the first and second regions to define fins made of the first semiconductor material, wherein the fins in the first region define a first fin structure of a FinFET transistor of a first conductivity type;
converting the fins in the second region made of said first semiconductor material into converted fins made of a second semiconductor material, wherein converting comprises:
covering the fins in the first region with a first protective layer;
epitaxially growing said second semiconductor material to cover at least side walls of the fins in the second region;
covering the second semiconductor material with a second protective layer;
driving said second semiconductor material into the fins made of the first semiconductor material to produce the converted fins made of the second semiconductor material which are wider than said fins made of the first semiconductor material; and
removing the first and second protective layers; and
laterally reducing a width of the converted fins made of the second semiconductor material in the second region to define a second fin structure of a FinFET transistor of a second conductivity type.

6. The method of claim 5, wherein removing portions comprises:
masking the bulk substrate layer with a fin mask;
etching the bulk substrate layer through said fin mask to remove portions of first semiconductor material of the substrate layer.

7. The method of claim 5, wherein laterally reducing comprises etching away wider portions of the converted fins made of the second semiconductor material.

8. The method of claim 7, further comprising further etching into the bulk substrate layer on either side of each converted fin made of the second semiconductor material so that each converted fin made of the second semiconductor material wherein laterally is supported by a fin region made of the first semiconductor material.

9. The method of claim 5, wherein driving comprises performing one of a condensation or anneal process.

10. The method of claim 1, wherein the first semiconductor material is silicon and the second semiconductor material is selected from the group consisting of silicon-germanium and silicon carbide.

11. A method, comprising:
providing a first fin made of a first semiconductor material in a first region of a substrate and a second fin made of said first semiconductor material in a second region of said substrate;
converting the second fin made of said first semiconductor material in the second region into a converted fin made of a second semiconductor material, wherein converting the second fin in the second region further comprises:
epitaxially growing said second semiconductor material to cover side walls of the second fin in the second region;
covering the second semiconductor material with a protective layer;
driving said second semiconductor material into the second fin made of the first semiconductor material to produce the converted fin made of the second semiconductor material; and
removing the protective layer;
reducing a width of the converted fin made of the second semiconductor material in the second region;
forming a FinFET transistor of a first conductivity type from said first fin; and
forming a FinFET transistor of a second conductivity type from said converted fin.

12. The method of claim 11, wherein providing the fins further comprises masking the substrate with a fin mask, the substrate being a top semiconductor layer of a silicon-on-insulator (SOI) substrate; and etching the top semiconductor layer through said fin mask to remove portions of first semiconductor material of the top semiconductor layer down to an insulating layer of the SOI substrate.

13. The method of claim 11, wherein reducing the width of the converted fin comprises etching away side portions of the converted fin made of the second semiconductor material.

14. A method, comprising:
providing a first fin made of a first semiconductor material in a first region of a substrate and a second fin made of said first semiconductor material in a second region of said substrate;
converting the second fin made of said first semiconductor material in the second region into a converted fin made of a second semiconductor material, wherein converting the second fin in the second region comprises:
covering the first fin in the first region with a first protective layer;
epitaxially growing said second semiconductor material to cover at least side walls of the second fin in the second region;
covering the second semiconductor material with a second protective layer;
driving said second semiconductor material into the second fin made of the first semiconductor material to produce the converted fin made of the second semiconductor material; and
removing the first and second protective layers;
reducing a width of the converted fin made of the second semiconductor material in the second region;
forming a FinFET transistor of a first conductivity type from said first fin; and
forming a FinFET transistor of a second conductivity type from said converted fin.

15. A method for forming silicon and silicon-germanium fin structures, the method comprising:
producing silicon fin structures in a first region and a second region;
covering the silicon fin structures in the first region with a first protective layer;
depositing a semiconductor material including germanium on the silicon fin structures in the second region;
epitaxially growing the semiconductor material to cover at least side walls of the silicon fin structures in the second region; and
covering the silicon fin structures grown with the semiconductor material with a second protective layer;
driving the germanium from the semiconductor material into the silicon fin structures in the second region to produce silicon-germanium fin structures, wherein driving drives germanium from the said silicon-germanium material into the silicon fin structures in the second region;
removing the first and second protective layers; and
reducing a width of the silicon-germanium fin structures in the second region.

16. The method of claim 15, wherein depositing comprises epitaxially growing a silicon-germanium material covering side walls of the silicon fin structures in the second region.

* * * * *

UNITED STATES PATENT AND TRADEMARK OFFICE
CERTIFICATE OF CORRECTION

| | |
|---|---|
| PATENT NO. | : 9,461,174 B2 |
| APPLICATION NO. | : 14/449192 |
| DATED | : October 4, 2016 |
| INVENTOR(S) | : Nicolas Loubet et al. |

It is certified that error appears in the above-identified patent and that said Letters Patent is hereby corrected as shown below:

In the Claims:

At column 10, claim number 11, line number 5, please replace the word [laver] with the word -- layer --.

Signed and Sealed this
Twenty-ninth Day of November, 2016

Michelle K. Lee
*Director of the United States Patent and Trademark Office*